United States Patent
Wagener et al.

(10) Patent No.: US 8,836,262 B2
(45) Date of Patent: Sep. 16, 2014

(54) METHOD AND ARRANGEMENT FOR DETERMINING THE DYNAMIC STATE OF AN ELECTRIC MOTOR

(71) Applicant: Dr. Fritz Faulhaber GmbH & Co. KG, Schoenaich (DE)

(72) Inventors: Andreas Wagener, Weil im Schoenbuch-Breitenstein (DE); Achim Haag, Leinfelden-Echterdingen (DE)

(73) Assignee: Dr. Fritz Faulhaber GmbH & Co. KG, Schoenaich (DE)

( * ) Notice: Subject to any disclaimer, the term of this patent is extended or adjusted under 35 U.S.C. 154(b) by 148 days.

(21) Appl. No.: 13/671,726

(22) Filed: Nov. 8, 2012

(65) Prior Publication Data

US 2013/0187581 A1    Jul. 25, 2013

(30) Foreign Application Priority Data

Nov. 25, 2011    (DE) .......................... 10 2011 055 717

(51) Int. Cl.
| | |
|---|---|
| H02K 29/10 | (2006.01) |
| H02P 6/16 | (2006.01) |
| H03M 1/10 | (2006.01) |
| G01P 3/489 | (2006.01) |
| G01D 5/245 | (2006.01) |
| G01D 5/20 | (2006.01) |
| H03M 1/64 | (2006.01) |
| H03M 1/30 | (2006.01) |

(52) U.S. Cl.
CPC ............... *H02P 6/16* (2013.01); *H03M 1/1038* (2013.01); *G01P 3/489* (2013.01); *G01D 5/2454* (2013.01); *G01D 5/208* (2013.01); *H03M 1/645* (2013.01); *H03M 1/30* (2013.01)
USPC ................... 318/400.4; 318/560; 318/400.38; 318/400.39; 318/400.14; 318/721

(58) Field of Classification Search
CPC .................................. H02K 29/10; H02P 6/16
USPC ............ 318/400.01, 400.05, 400.14, 400.15, 318/400.07, 400.38, 400.39, 400.4, 560, 318/605, 661, 701, 721, 727, 799, 801, 430, 318/432, 437; 345/165; 708/112
See application file for complete search history.

(56) References Cited

U.S. PATENT DOCUMENTS 5,932,986 A  *  8/1999  Henry et al. .................. 318/601
6,184,639 B1     2/2001  Wallner
(Continued)

FOREIGN PATENT DOCUMENTS

DE    42 17 265      12/1993
DE    198 15 964     10/1999
(Continued)

OTHER PUBLICATIONS

German Search Report dated Jul. 27, 2012 in German Patent Application No. 10 2011 055 717.2 with English translation of relevant parts.

(Continued)

*Primary Examiner* — Antony M Paul
(74) *Attorney, Agent, or Firm* — Collard & Roe, P.C.

(57) ABSTRACT

In a method for the determination of a current initial rotational position of a rotor and in an arrangement for carrying out same, an incremental position encoder outputs an output signal. The output signal is produced by superposition of a chronologically random and systematically fluctuating signal interference on a basic signal, and composed of at least two component signals which change periodically in accordance with the rotational position of the rotor and are in a fixed angular relationship to one another. To determine the position, the output signal is used exclusively. The current initial rotational position of the rotor relative to a reference initial rotational position is determined by comparing the time profile of the portion of the systematically fluctuating signal interference of a current measured value sequence of the signal and the measured values of a signal sequence acquired starting from the reference initial rotational position.

26 Claims, 9 Drawing Sheets

(56) References Cited

U.S. PATENT DOCUMENTS

Figure 1:
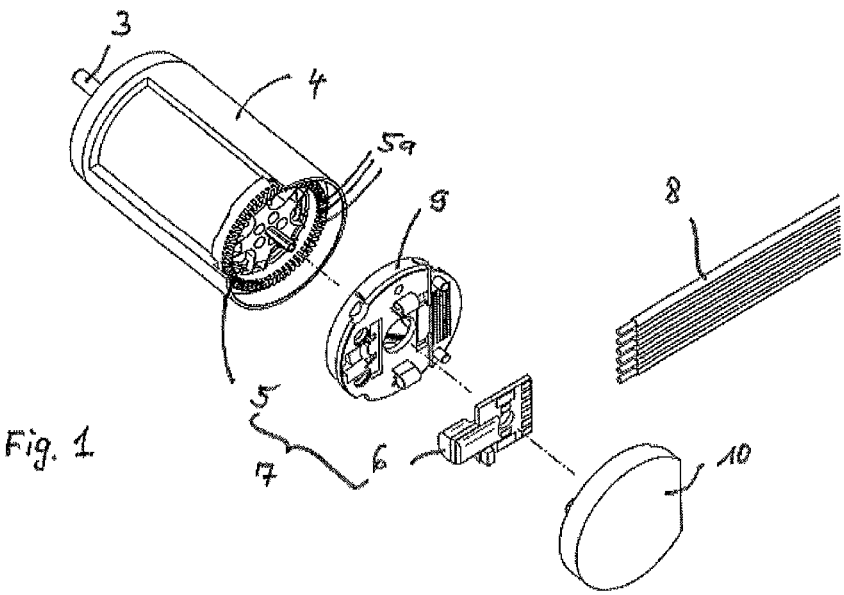

| | | | |
|---|---|---|---|
| 7,696,705 B2 | 4/2010 | Stork | |
| 7,800,325 B2 | 9/2010 | Song et al. | |
| 8,198,842 B2 | 6/2012 | Wallrafen | |
| 2005/0072911 A1 | 4/2005 | Kuroda et al. | |
| 2006/0097108 A1 | 5/2006 | Liu et al. | |
| 2006/0279239 A1 | 12/2006 | Hwang | |
| 2007/0029955 A1 | 2/2007 | Kanekawa et al. | |
| 2007/0176568 A1 | 8/2007 | Robichaux et al. | |
| 2011/0187355 A1 | 8/2011 | Dixon et al. | |
| 2012/0010849 A1* | 1/2012 | Yamada | 702/151 |

FOREIGN PATENT DOCUMENTS

| | | |
|---|---|---|
| DE | 10 2004 062 118 | 1/2006 |
| DE | 10 2006 017 024 | 12/2007 |
| DE | 10 2008 010 964 | 8/2009 |
| DE | 11 2007 001 939 | 9/2009 |
| DE | 10 2010 031 813 | 9/2011 |
| EP | 1 596 493 | 11/2005 |
| JP | 2008-076078 | 4/2008 |
| JP | 2011-141207 | 7/2011 |

OTHER PUBLICATIONS

European Search Report dated May 4, 2012 in European Patent Application No. 12152859 with English translation of relevant parts.
Schwarz, R. et al., "Increasing Signal Accuracy of Automotive Wheel-Speed Sensors," Proceedings of the American Control Conference, Albuquerque, New Mexico, Jun. 1997, pp. 1131-1135. (Spec, pp. 2-3).

* cited by examiner

Fig. 9 $\vec{\phi}_{x,x} (\vec{\phi}_{y,y})$
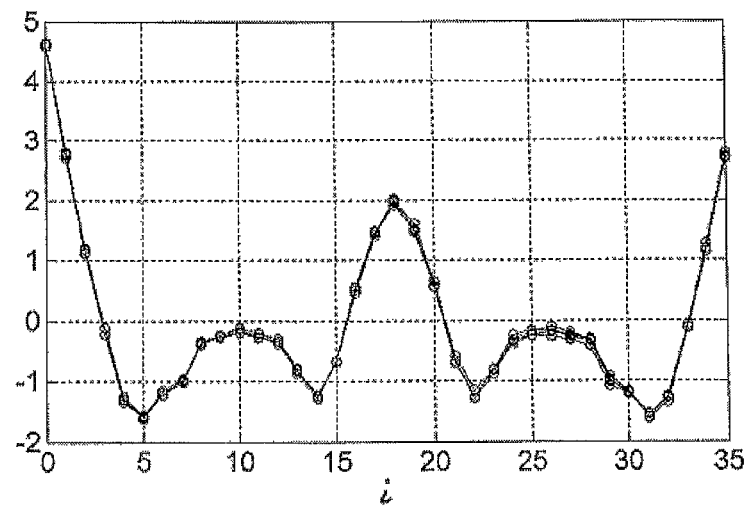
Fig. 10 $\vec{\phi}_{x,x} (\vec{\phi}_{y,y})$
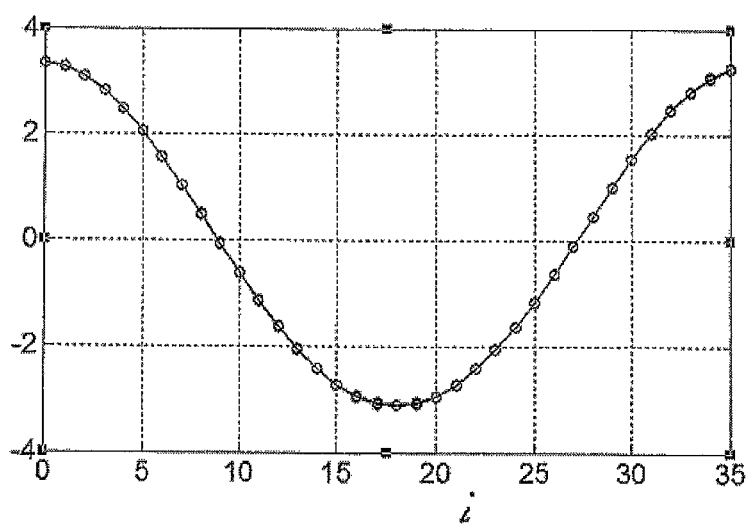

METHOD AND ARRANGEMENT FOR DETERMINING THE DYNAMIC STATE OF AN ELECTRIC MOTOR

CROSS REFERENCE TO RELATED APPLICATIONS

Applicant claims priority under 35 U.S.C. §119 of German Application No. 10 2011 055 717.2 filed on Nov. 25, 2011, the disclosure of which is incorporated by reference.

The present invention relates to a method and to an arrangement for detecting the dynamic state of an electric motor, in particular of a brushless, electronically commutated direct current small servomotor, wherein an incremental position encoder is used which respectively outputs an output signal for a number of increments within one revolution of the rotor, which output signal is produced by superposing chronologically random and systematically fluctuating signal interference on a basic signal, wherein the basic signal is composed of at least two component signals which change periodically in each case in accordance with the rotational position of the rotor and are in a fixed angular relationship with one another.

For high-quality positioning tasks of servomotors in an angular range of less than a degree, a position resolution of significantly below 0.1° per revolution of the rotor corresponding to a number of increments of significantly above 3600 per revolution, is required for precise and dynamic control of even structurally very small drives.

To operate brushless, electronically commutated direct current motors (DC motors), on the one hand the absolute rotational position of the rotor with respect to the winding system for the commutation is necessary here, on the other hand, for example for various positioning tasks which are operated directly, that is to say without transmissions, additionally knowledge of the absolute rotational position of the rotor within one revolution of the motor is also required.

It is known that incremental determination of the position of the rotor rotational position can be carried out with high resolution by, for example, an optical position encoder which is built onto a motor, wherein an index signal is made available for the number of chronological increments within one revolution of the rotor. To operate brushless direct current motors, these are also combined with digital Hall sensors in order to acquire additional information for the electronic commutation (EC). By means of a reference journey until the occurrence of the index signal, it is also possible here for a high resolution angular information item, which is absolute within one angle, to be determined after any switching on process. The customary size of the optical position encoders, which typically have a diameter which is a multiple of the diameter of a small motor which is provided for the positioning task, is disadvantageous here.

According to DE 10 2008 010 964, it is alternatively possible to dispense with an index signal of the encoder by virtue of the fact that the rotor is initially moved into a magnetically pronounced reference position and the rotor position is referenced with respect thereto. The comparatively imprecise reference position is disadvantageous here since, due to changing ambient conditions such as temperature or friction, the rotor can be referenced only in an angular range of the incremental encoder which clearly exceeds an increment of the high-resolution encoder.

The specialist article R. Schwarz et al.: "Increasing Signal Accuracy of Automotive Wheel-Speed Sensors by On-Line Learning" in Proceedings of the American Control Conference, Albuquerque, N. Mex., June 1997, pages 1131-1135, also discloses a method in which correction factors which are determined for the encoder compensation of an incremental encoder are stored over a time period in which it is not possible to evaluate a speed owing to excessively slow movement of the sensor. After movement starts again, new correction factors are determined for the speed signal and are assigned again to the previously stored correction factors by means of a correlation of the two signal sequences. This is a method for correcting a speed which is determined from an incremental encoder signal. The object of the method is not to determine an absolute position of the drive system.

A further advantageous possibility for high-resolution detection of a rotor position which is known from the Applicant's fabrication program is the integration of a magnetic sensor based on the evaluation of changing magnetic field strengths into an electric motor. In one combination of the sensor, in particular of what is referred to as an AMR (anisotropic magnetoresistive) sensor, with an axially magnetized encoder wheel which is structured with a mechanically relatively high number of poles and is, in particular, toothed, it is possible here for a resolution of for example $100*10^3$ increments per revolution of the rotor to be achieved, even for motors of not more than 8 mm in diameter. A sensor array preferably generates for this purpose a basic signal which is composed of two component signals which change periodically in each case in accordance with the rotational position of the rotor and are in a fixed angular relationship with one another. In particular, these are two electrical component signals which are offset harmonically with respect to one another by a quarter period and are proportional to the magnetic field.

The number of signal periods per revolution corresponds here to the structuring of the encoder wheel. The encoder resolution arises here in accordance with the number of chronological increments within one revolution of the rotor, which number can be determined as a product of the number of teeth of the encoder wheel and an interpolation factor within one signal period. Methods such as interpolation factors and interpolated positions which can be defined within one period of a harmonic, in particular sinusoidal, position signal are known from the literature, in particular from DE 198 15 964 B4 and U.S. Pat. No. 7,800,325 B2. It is disadvantageous here that again only one high-resolution incremental position is determined wherein an unambiguous reference position can be determined without additional sensors or methods owing to the ambivalence of the harmonic output signal of the position encoder, specifically in one quadrant of a revolution, but not within one entire revolution of the rotor.

In one output signal which is supplied by a position encoder, it is possible, in particular, for chronologically randomly and systematically fluctuation interference signals to be superimposed on a high-frequency basic signal. It is therefore possible, for example in the case of AMR encoders, that, due to fabrications tolerances of the encoder wheel, the characteristics of the signals of the harmonic oscillations, such as amplitude and phase difference, vary for each tooth of the encoder wheel. The signal fluctuations may be caused here, for example, by nonuniform magnetization, variations in the height of the teeth as well as by a less than ideally level installation of the encoder wheel, that is to say it is oriented parallel to the sensor array, and a distance between the encoder wheel and the sensor array which, as a result, varies within one revolution.

So that the precision of a rotor rotational angle position which is determined as a result is not adversely affected by signal interference during the evaluation of the output signals, methods such as are known, for example, from DE 10 2010 031 813 A1 or DE 198 15 964 B4 can be used for compensating different amplitudes and phase differences before the calculation of the angle. EP 1 596 493 A1 also discloses a method according to which the angular errors of an encoder system with a relatively high number of poles are corrected by computationally correcting segment lengths of an encoder system with respect to a central segment length in order to determine the rotational speed. It is characteristic of all these known methods that interference influences acting on the signal can be eliminated, in particular, by calculating correction values for the measured values of the encoder output signal.

The invention is based on the object of providing a method which has the features mentioned at the beginning and an arrangement for detecting the dynamic state of an electric motor, in particular of a brushless, electronically commutated direct current small servomotor, wherein, in particular by using a highly interpolated encoder system which is ambiguous within one revolution of the motor, a determination of a current rotational position as well as a current initial rotational position, which is unambiguous within one revolution and is robust with respect to the mechanical loading of the motor and with respect to fabrication tolerances of a position encoder, is to take place relative to a reference initial rotational position. In this context, this current initial rotational position, which can be used in a referencing fashion for a current rotational position of the rotor during operation of the motor, is to be acquired explicitly on the basis of an evaluation of the signals of the specified, in particular multi-pole, encoder system so that the method according to the invention can also be used for motors with a small diameter. The structural expenditure is to be kept small here. The intention is therefore, in particular, that there will be no additional sensor for the determination of the current initial rotational position which can be considered as referencing for a rotational position of a rotor at a particular time.

This object is achieved according to the invention by means of a method for detecting the dynamic state of an electric motor which has a stator and a rotor, in particular of a brushless, electronically commutated direct current small servomotor, comprising unambiguous determinations of rotational positions of the rotor within one revolution of the rotor, specifically of a current rotational position of the rotor relative to a current initial rotational position of the rotor as well as the determination of this current initial rotational position relative to a reference initial rotational position of the rotor, wherein an incremental position encoder is used which respectively outputs an output signal for a number of chronological increments within one revolution of the rotor, which output signal is produced by superposition of a basic signal with chronologically randomly and systematically fluctuating signal interference, wherein the basic signal is composed of at least two component signals which change periodically in each case in accordance with the rotational position of the rotor and are in a fixed angular relationship with one another, wherein the current initial rotational position is determined exclusively from the output signal of the position encoder and is determined by comparing the time profile of the portion of the systematically fluctuating signal interference of measured values of a current signal sequence with a time profile of the portion of the systematically fluctuating signal interference of measured values of a signal sequence, acquired from the reference initial rotational position, of the output signal of the position encoder.

On the other hand, this object is achieved according to the invention by means of an arrangement for detecting the dynamic state of an electric motor, in particular of a brushless, electronically commutated direct current small servomotor, comprising a motor actuation means for the electric motor, an incremental position encoder and a signal processing unit, wherein the processing unit which is used for unambiguously determining rotational positions of the rotor within one revolution of the rotor of the electric motor, specifically a current rotational position relative to a current initial rotational position and this current initial rotational position relative to a reference initial rotational position, comprises a unit for determining a signal sequence which is characteristic of a signal of the position encoder, a nonvolatile memory for at least one reference sequence of the signal, and two units for determining, in each case, a first evaluation characteristic variable or a second evaluation characteristic variable for the signal sequences, as well as in each case one unit, which is assigned to each unit for determining the evaluation characteristic variables and has the purpose of determining an angular offset of the current initial rotational position relative to the reference initial rotational position from the comparison of a current signal sequence with at least one reference sequence which is stored in read only memory, wherein the units for determining the angular offset are configured in such a way that the angular offset is determined according to, in each case, different method types for signal processing of the current signal sequence.

The invention is supported here, in particular, on the similarity of a characteristic time profile of the portion of the systematically fluctuating signal interference of a current output signal of the position encoder with a characteristic time profile of the portion of the systematically fluctuating signal interference of an output signal for the reference initial rotational position. Instead of attempting here to compensate the existing interference by various types of correction methods, the interference is used to determine the current initial rotational position of the rotor in its relationship with a reference initial rotational position as an angular offset.

In order to be able to compare the time profile of the portion of the systematically fluctuating signal interference it is, on the one hand, possible to start directly from the measured values of the currently determined signal sequence and of the signal sequence, acquired for the reference initial rotational position, of the output signal of the position encoder or also to provide that the time profile only of the signal interference of the output signal is respectively extracted before further signal processing from the signal sequences of the output signal by forming mean values of the measured values and subtracting the mean value from the respective measured values of the signal sequences from the signal sequences and to be used as a basis for further evaluation.

The measured values of the signal sequence, acquired from the reference initial rotational position and, if appropriate, the isolated values of the signal interference of the output signal of the position encoder can preferably be determined after an initial orientation of the rotor, defined for example during final testing after the fabrication of the electric motor, in a preferred rotational position or by coupling to an external reference encoder, and stored in a nonvolatile memory.

Before any signal processing for the purpose of performing the comparison which is to be carried out according to the invention, the measured value sequences can, if necessary, be made compatible with one another by adjusting a sequence acquired during operation, for example during a reference journey, of characteristic signal values with respect to a reference sequence stored in the memory of the drive. In order to adjust the measured value sequences, it is possible, in particular, to compare the number of measured values of the current signal sequence of the output signal of the position encoder with the number of measured values of the signal sequence, acquired starting from the reference initial rotational position, of the output signal of the position encoder. If the number of measured values of the current signal sequence is higher than the number of measured values of the signal sequence acquired starting from the reference initial rotational position, an adjusted signal sequence with the same number of measured values as the number of measured values of the current signal sequence can be formed by simple or multiple complete and/or partial repetitive appending of the measured values to the signal sequence from the signal sequence acquired starting from the reference initial rotational position. The adjusted signal sequence can then, as described below for the original measured values, be used instead of the signal sequence acquired starting from the reference initial rotational position.

In order to sense the nature of the interference influences in the output signals of the encoder, it can advantageously be provided that in each case an evaluation characteristic variable for the characteristic of the time profile of the interference is determined from the signal sequences of the time profile of the signal interference of the output signal which was determined from the reference initial rotational position and/or of the output signal in the current rotational position of the rotor. In accordance with a value of these evaluation characteristic variables a selection of a first or of a second method type can then be made, according to which in each case the comparison of the time profile of the portion of the systematically fluctuating signal interference of the current output signal is made with the time profile of the portion of the systematically fluctuating signal interference of the output signal of the precision encoder in the reference initial rotational position.

It is also possible that the numerical values which are determined for the evaluation characteristic variables indicate that the signal sequences which are available cannot be processed in a way which provides sufficient precision. This is then the case, for example, if, on the one hand, the time profile of the signal interference of the current output signal of the position encoder does not differ significantly from a basic signal having signal interference which fluctuates chronologically in an exclusively random way, which can be signaled by a first evaluation characteristic variable and if, on the other hand, at the same time the time profile of the signal interference of the current output signal of the position encoder also has a basic oscillation portion for the systematically fluctuating signal interference which does not differ significantly from all the other oscillation portions of the signal interference, which can be indicated by a second evaluation characteristic variable. In this case, a change in the conditions of use of the incremental position encoder and/or in the incremental position encoder itself can take place in such a way that, at least for the second evaluation characteristic variable, a sufficiently significant time measured value profile for the determination of the current initial rotational position can be forcibly brought about within the current output signal of the position encoder by, for example, optimizing mechanical properties of an encoder wheel, serving to acquire measured values, in an AMR measurement arrangement.

If the time profile of the signal interference of the current output signal of the position encoder differs significantly from a basic signal having signal interference which fluctuates chronologically in an exclusively random way fluctuating signal interference, a first method type can be selected according to which in each case the time profile of the portion of the systematically fluctuating signal interference of the current output signal is compared with the time profile of the portion of the systematically fluctuating signal interference of the output signal of the position encoder in the reference initial rotational position. According to this first method type it can be provided that a cross-correlation function is formed from the measured values of the current signal sequence and from the measured values of the signal sequence acquired starting from the reference initial rotational position. The current initial rotational position can be determined therefrom in its relationship with the reference initial rotational position as an angular offset which is obtained from the abscissa value of the maximum of the cross-correlation function.

If the condition mentioned above is not met, but the second evaluation characteristic variable indicates a measured value significance, sufficient for precise determination of the current initial rotational position, with respect to the second method type according to which in each case the time profile of the portion of the systematically fluctuating signal interference of the current output signal can be compared with the time profile of the portion of the systematically fluctuating signal interference of the output signal of the position encoder in the reference initial rotational position, and it is therefore possible to implement this second method type in terms of signaling equipment. According to this method type, it is possible to determine the current initial rotational position in its relationship with a reference initial rotational position from the measured values of the signal sequences, in particular according to a Fourier transformation of the measured values, as an angular offset which is obtained from a difference between the phase positions of the basic oscillation portions of the signal sequences.

The method according to the invention can advantageously be implemented with incremental position encoders which contain inductive sensors, magnetic sensors such as Hall sensors, AMR sensors or GMR sensors, or optical sensors. The number of increments can lie here in a range from 3000 to 100,000 with respect to one complete revolution of the rotor, with the result that advantageously highly precise resolution is obtained.

Further advantageous embodiment features of the invention are contained in the dependent claims and in the following description.

The invention is explained in more detail with reference to an inventive exemplary embodiment which is illustrated by means of the appended drawing.

Figure 2:
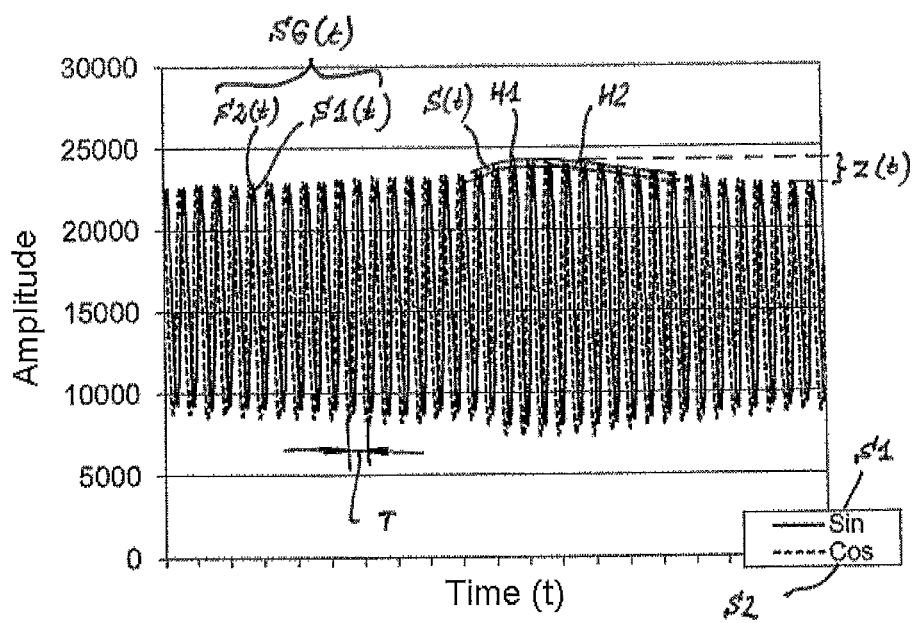
Figure 3:
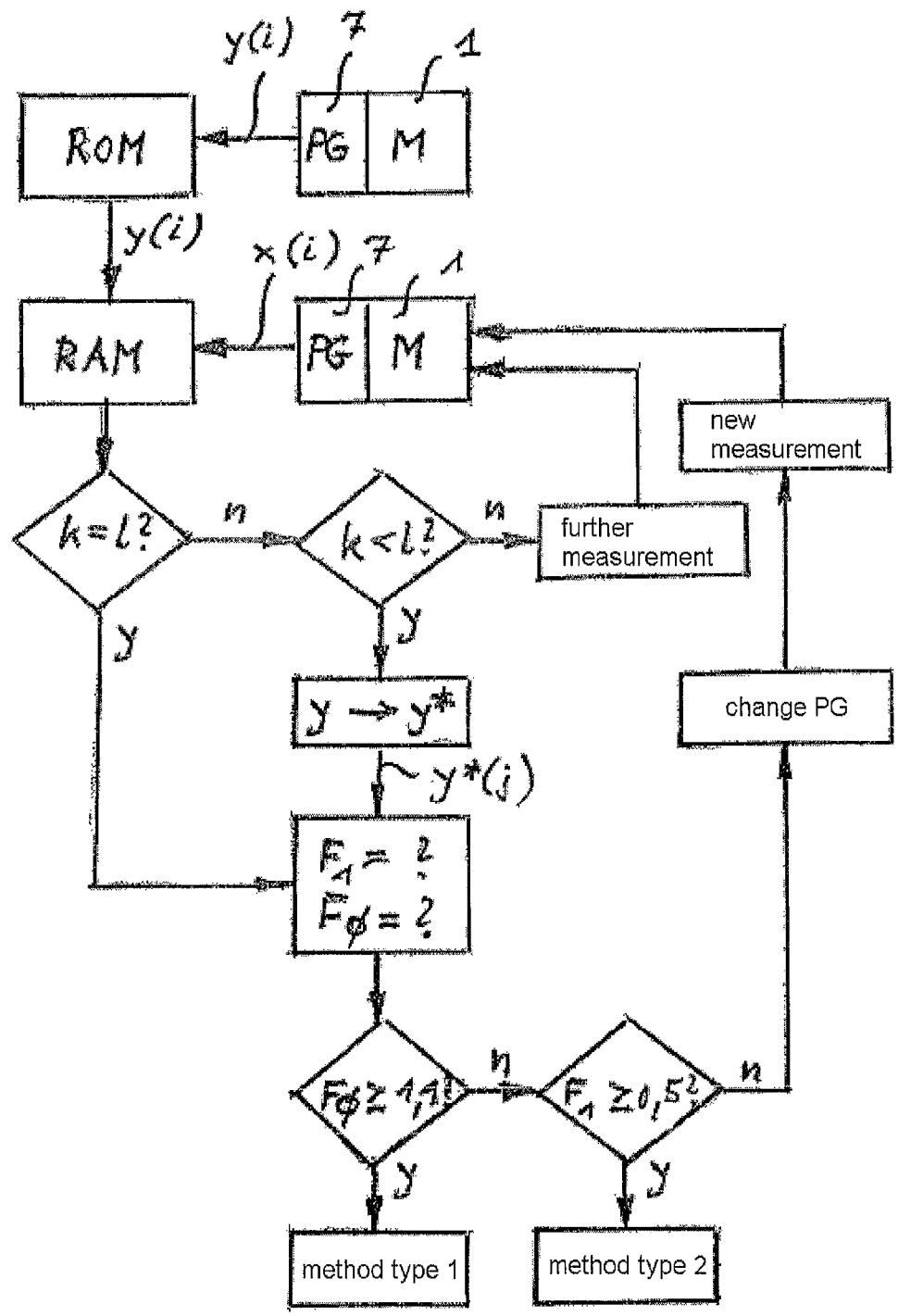
Figure 4:
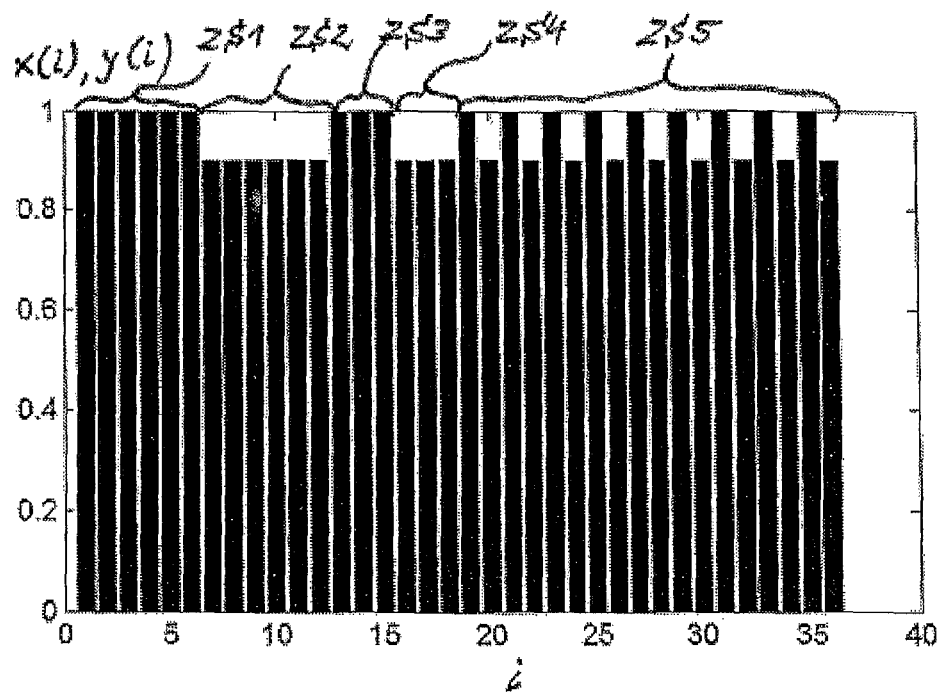
Figure 5:
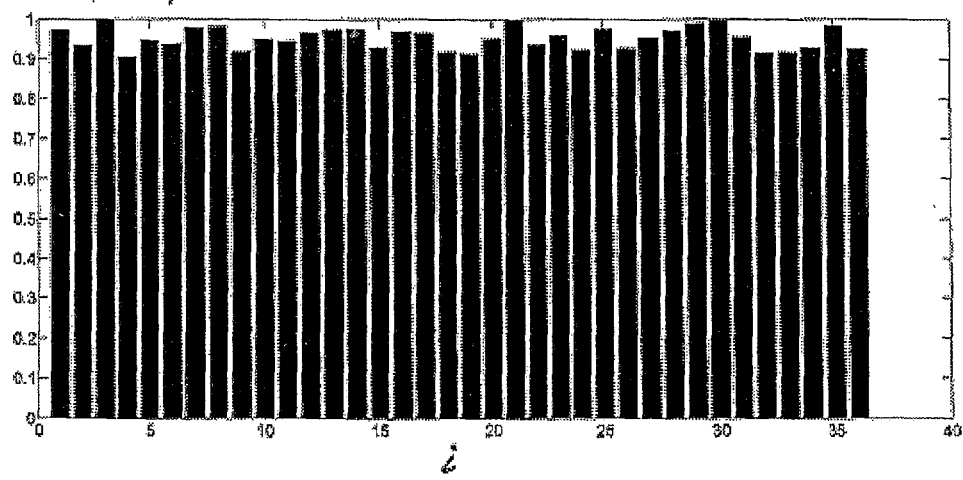
Figure 6:
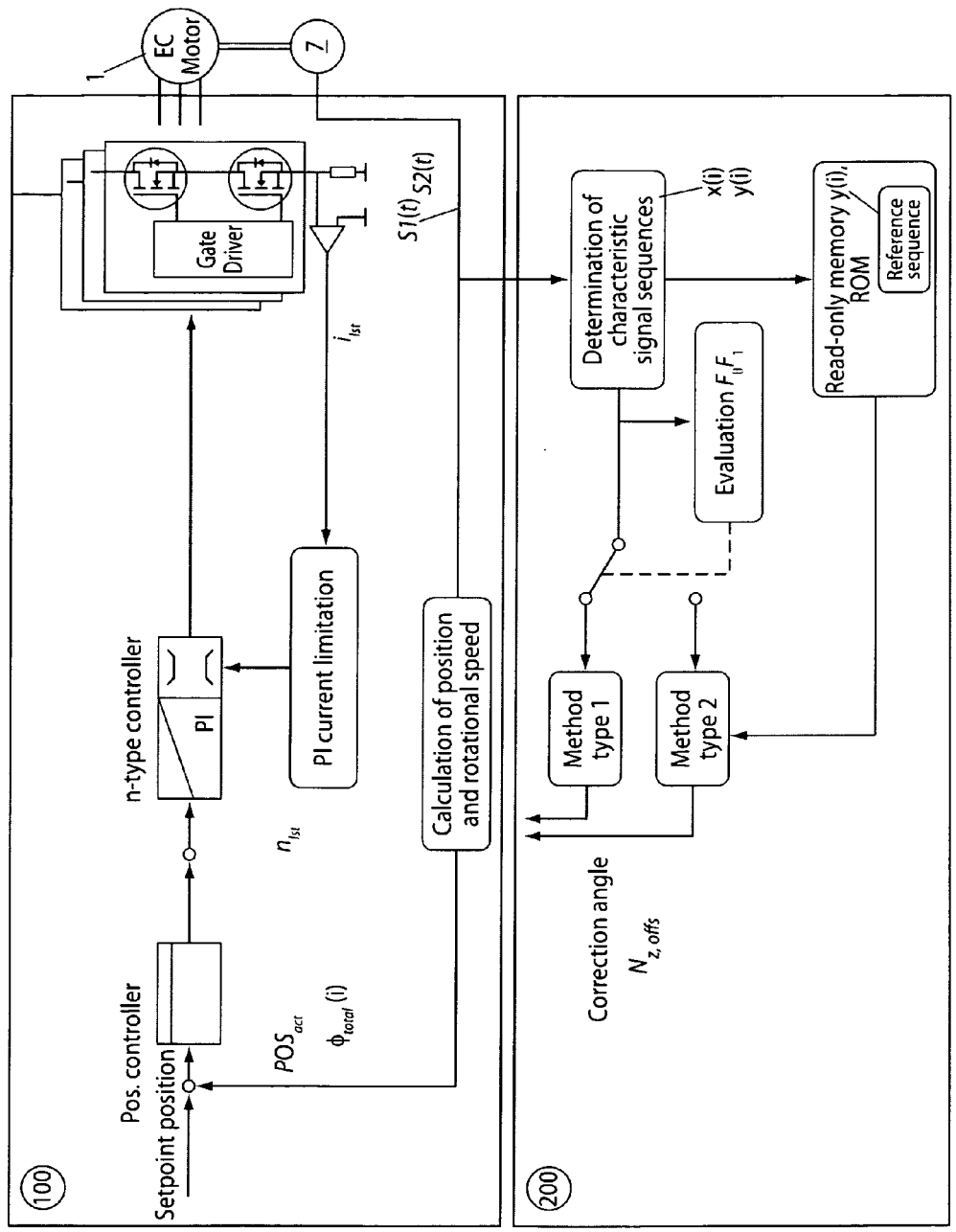
Figure 7:
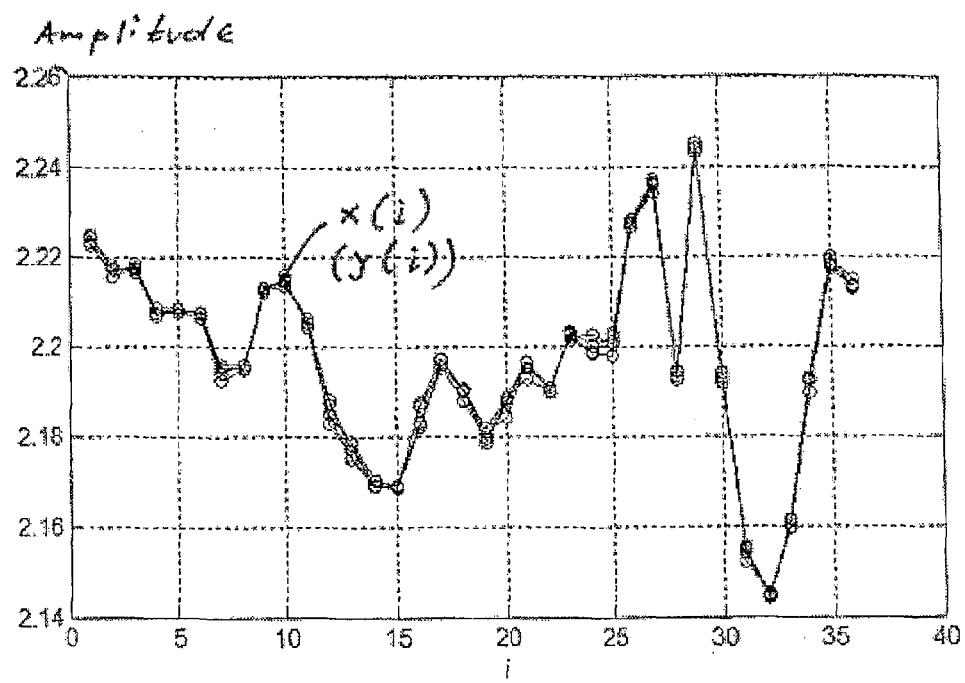
Figure 8:
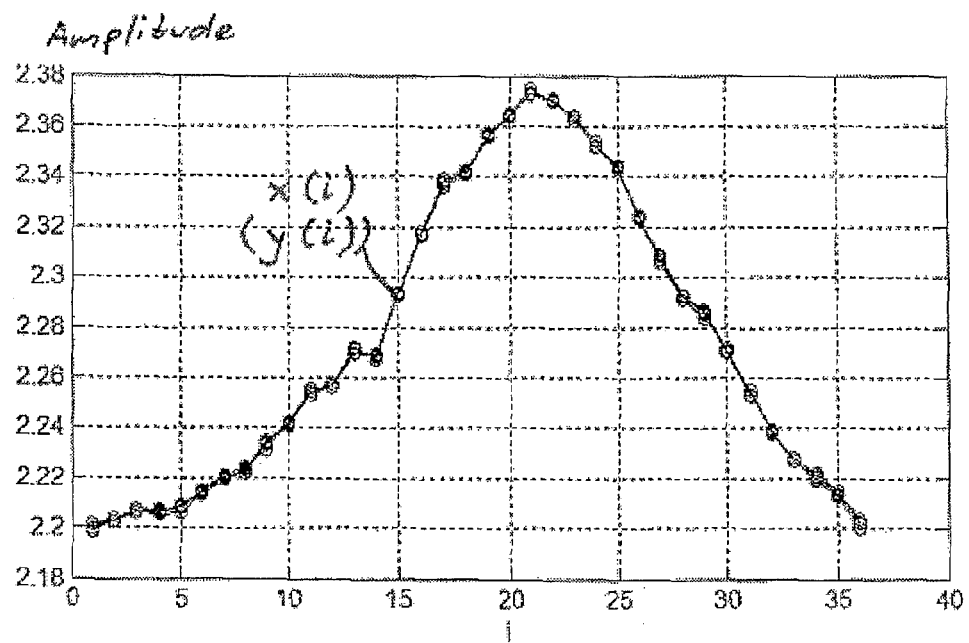
Figure 11:
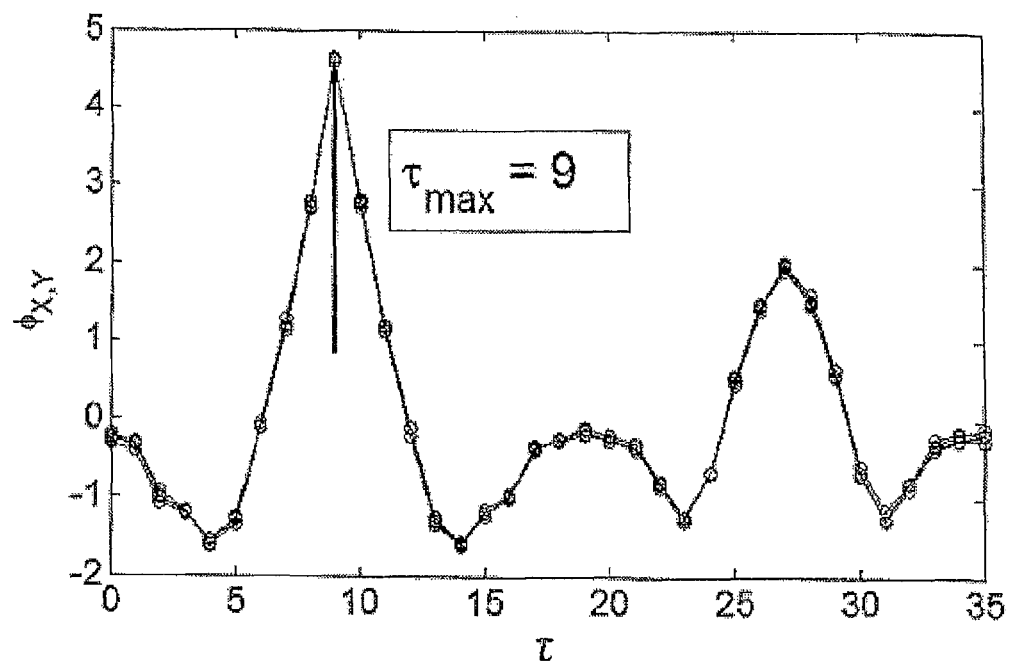
Figure 12:
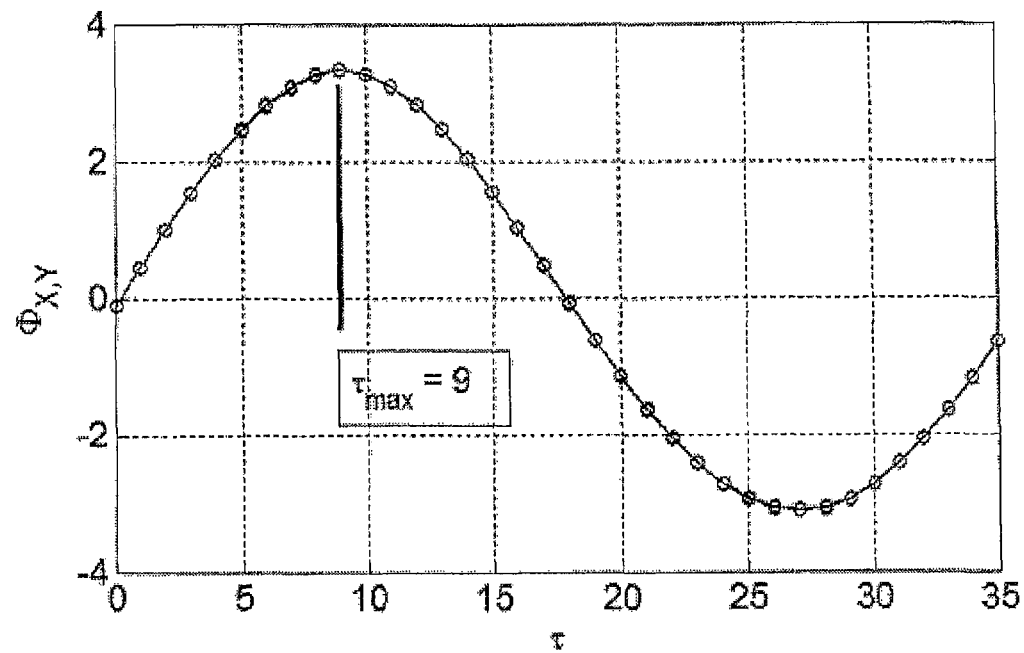
Figure 13:
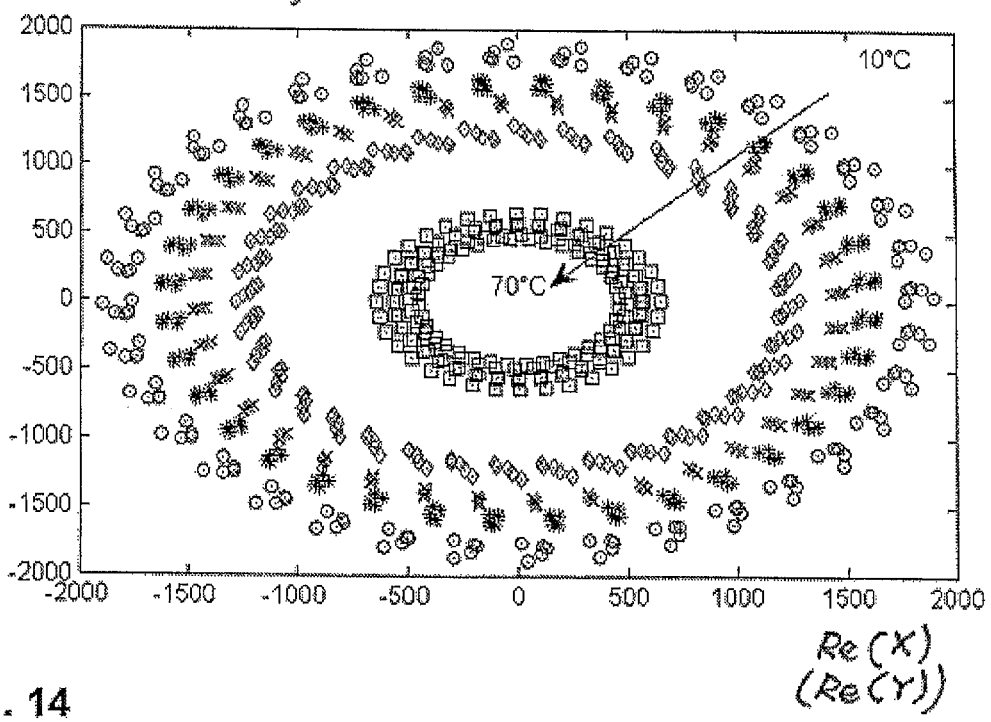
Figure 14:
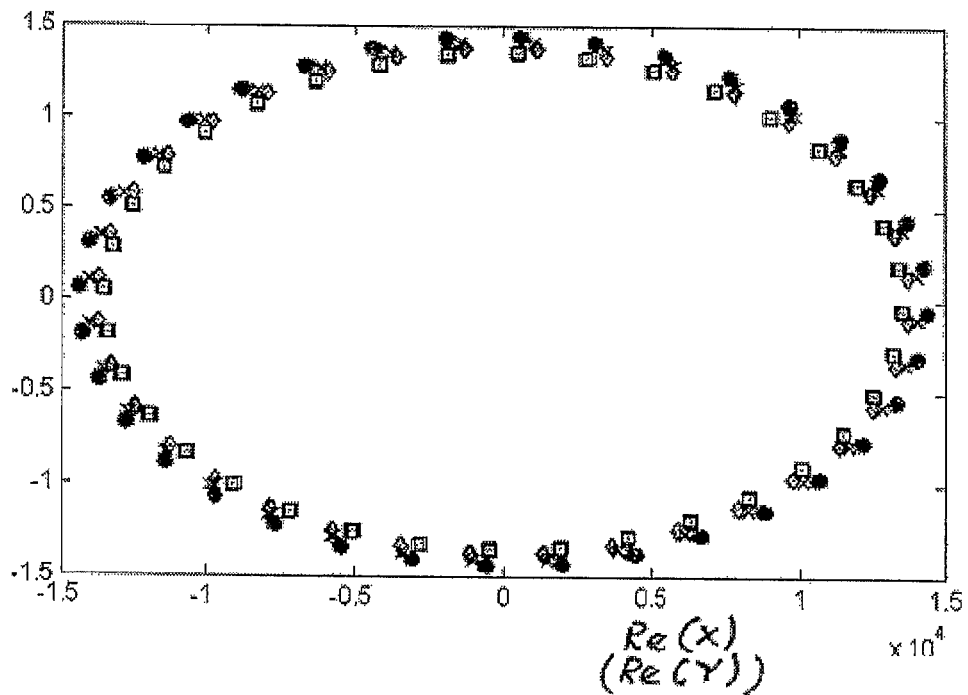
Figure 15:
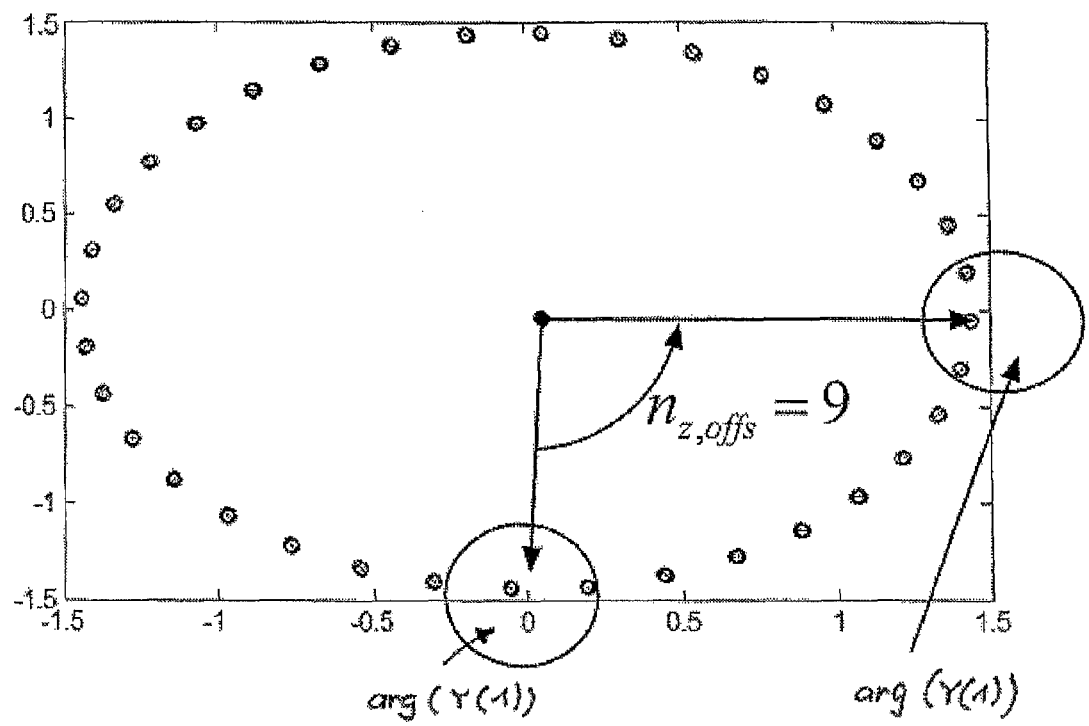
Figure 16:
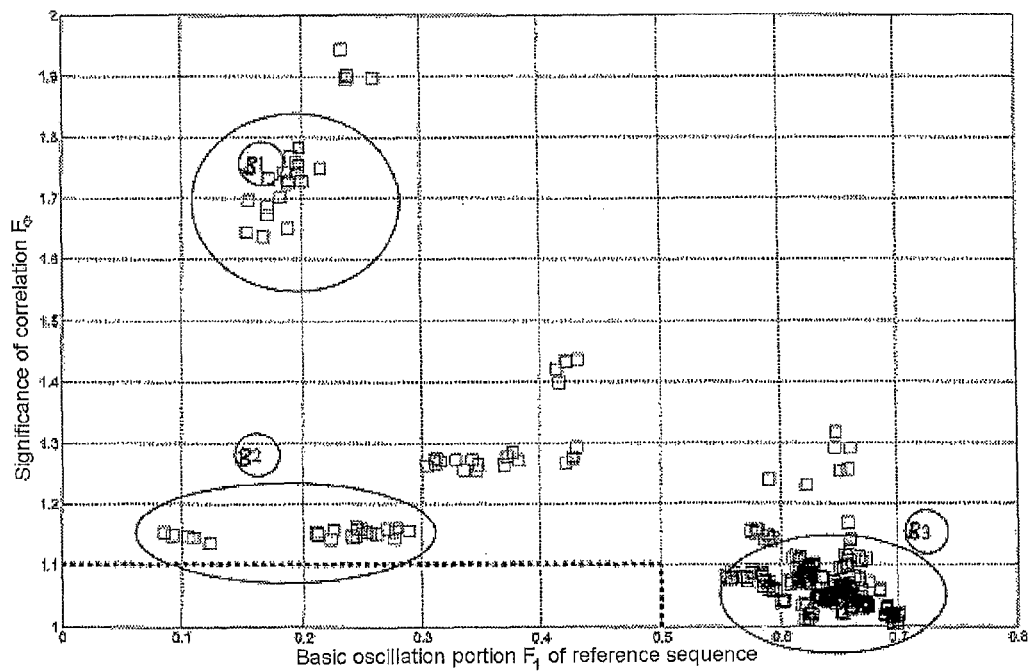

In said drawing:

FIG. 1 shows a perspective illustration of a direct current small motor whose dynamic state can be detected by means of the method according to the invention, FIG. 2 shows the exemplary profile of an output signal of an incremental position encoder which is used in the method according to the invention, FIG. 3 shows a simplified signal flowchart of a method according to the invention, FIG. 4 shows a first possible standardized profile of an encoder characteristic of an incremental position encoder which can be used in the method according to the invention, FIG. 5 shows a further possible standardized profile of an encoder characteristic of this type, FIG. 6 shows a diagram of an arrangement which is formed from a motor activation means for a small motor and a signal processing unit and has the purpose of carrying out the method according to the invention, FIG. 7 shows a diagrammatic illustration of a first exemplary time profile of measured values in a signal sequence of an output signal of an incremental position encoder, used in the method according to the invention, at various temperatures, FIG. 8 shows a diagrammatic illustration of a second exemplary time profile of measured values in a signal sequence of an output signal of an incremental position encoder, used in the method according to the invention, at various temperatures, FIG. 9 shows a diagrammatic illustration of an auto-correlation function acquired from the first exemplary profile of measured values according to FIG. 7, at various temperatures, FIG. 10 shows a diagrammatic illustration of an auto-correlation function acquired from the second exemplary profile of measured values according to FIG. 8, at various temperatures, FIG. 11 shows a diagrammatic illustration of a cross-correlation function, calculated from a current signal sequence and the measured values according to the first exemplary profile of the measured values according to FIG. 7 as a reference sequence, FIG. 12 shows a diagrammatic illustration of a cross-correlation function, calculated from a current signal sequence and the measured values according to the second exemplary profile of the measured values according to FIG. 8 as a reference sequence, FIG. 13 shows a diagram of Fourier-transformed basic oscillation portions acquired from the first exemplary profile of measured values according to FIG. 7, at various temperatures, FIG. 14 shows a diagram of Fourier-transformed basic oscillation portions acquired from the second exemplary profile of measured values according to FIG. 8, at various temperatures, FIG. 15 shows a diagram as in FIG. 14 but only at a single temperature, it being shown that an angular offset with respect to the reference position can be determined therefrom, FIG. 16 shows a diagrammatic field illustration of the characteristic values of a first and of a second evaluation characteristic variable for various incremental position encoders, for the time profile of measured values in a signal sequence which is respectively determined with the incremental encoder.

With respect to the subsequent description it is expressly emphasized that the invention is not restricted to the exemplary embodiments and at the same time also not to all of the features or to a plurality of the features of described feature combinations, but instead each individual component feature of the exemplary embodiment, or of each exemplary embodiment, can have an inventive meaning in itself, even detached from all the other component features described in conjunction therewith, and even in combination with any desired features of another exemplary embodiment.

In the figures of the drawing, identical parts are also always provided with the same reference symbols, with the result that they are generally also each described only once.

The electric motor 1 which is shown in perspective and partially in an exploded illustration in FIG. 1 is a DC small motor, in particular, an EC small motor whose dynamic state can be detected by means of the inventive method.

The drawing shows the windings of the coil as well as the shaft 3 of the rotor 2 of the electric motor, which are mounted in a housing 4. In the illustrated preferred embodiment, the coil is seated in a rotationally fixed fashion on the shaft 3. The rotor 2 is not wound onto an iron core but instead is composed of the self-supporting coil which is, in particular, wound in an oblique winding and encloses a stator magnet which cannot be seen. The housing 4 forms here the iron return.

A magnetic toothed ring 5 having a number $n_z$ of teeth 5a is attached to the rotor 2, in particular in a rotationally fixed fashion to the shaft 3, which toothed ring 5 forms an incremental position encoder 7 together with a specific hybrid circuit of sensor electronics 6. Contact can be made with the sensor electronics via a cable connection 8, in particular, as illustrated, by means of a ribbon cable, and in the mounted state said sensor electronics are arranged coaxially with respect to the magnetic toothed ring 5, between an inner cover 9 and an outer cover 10. A sensor which is integrated into the sensor electronics 6 converts magnetic field differences between the tooth head and the tooth foot into electrical signals.

A sensor array of the sensor electronics 6 generates here a basic signal SG, as is illustrated by way of example in FIG. 2. This basic signal SG is composed here of at least two component signals S1, S2 which each change periodically in accordance with the rotational position of the rotor 2 and are in a fixed angular relationship with one another. The signals can, as shown in FIG. 2, be conceived of as functions of time S(t), S1(t), S2(t) or as functions of the rotational angle S(φ), S1(φ), S2(φ).

The component signals S1, S2 can, as is apparent from FIG. 2, preferably be two electrical signals S1, S2 of the same frequency which are offset with respect to one another by a quarter period (90°), change periodically, in particular are harmonic, and are proportional to the magnetic field of the encoder wheel 5. The first component signal S1 in FIG. 2 is here a sine signal, and the second component signal S2 is a cosine signal.

Such signals S1, S2 can also be acquired, for example, by means of an optical encoder. It is therefore possible for a multi-component encoder disk with low inertia to be arranged in such an encoder instead of the magnetic disk 5, which encoder disk is irradiated by, for example, infrared light using a transillumination method. The sensor electronics 6 must then contain a corresponding optical sensor in a complementary fashion. In an optical incremental position encoder 7 which is formed in this way, the irradiated light can be reflected and/or absorbed and in this way generates the phase-shifted pulses.

The number $n_z$ of the signal periods T per revolution—in FIG. 2 the conditions for one revolution of the rotor 3 are illustrated—results from the structuring of the encoder wheel 5, for example from how many teeth 5a, or, generally speaking, poles, the encoder wheel 5 has. An encoder resolution which is expressed in angle units or an increment Δφ is obtained here for the illustrated magnetic position encoder 7 by dividing the angle of 360°, corresponding to one revolution of the rotor 2, by the product of the number $n_z$ of the signal periods of the incremental encoder signal per revolution of the motor and an interpolation factor $n_i$ within one signal period T. The number $n_z$ of the signal periods is determined here, for example by the number of teeth of an encoder, which number is 36 in the illustrated case. For example, in the case of an interpolation factor of $n_i=1$, four position increments Δφ per tooth 5a are output when the two component signals S1, S2 which are offset by 90° are evaluated.

The angle within one revolution is then obtained according to equation (1) as:

$$\varphi_{ges}(i) = n_{z,\mathit{offs}} \cdot \frac{2\pi}{n_z} + \varphi(i) = n_{z,\mathit{offs}} \cdot \frac{2\pi}{n_z} + \arctan\left(\frac{S1(i)}{S2(i)}\right) \quad (1)$$

where:

$\phi_{ges}(i)$—is a current angle within one revolution, $n_{z,offs}$—is a current angular offset with respect to the zero position (current initial rotational position A with respect to reference initial rotational position O) of one revolution in tooth divisions, $n_z$—is the number of the signal periods of the incremental encoder signal per revolution of the motor, $\phi(i)$—is a current angle within the tooth division from the evaluation of the two signals which are shifted by 90°, and i is a dimensionless discretized sampling variable where $i=t_i/T$, where $t_i$ is the current time and T is the duration of one signal period.

As already mentioned, it is possible, for example due to fabrication tolerances or also due to the installation conditions of the encoder, for the characteristics of the component signals S1, S2, such as amplitude and phase difference, to vary for each tooth 5a of the encoder wheel 5. The amplitude fluctuations of the component signals S1, S2 are illustrated here in FIG. 2, in particular, by the envelope curves H1, H2. The fluctuations of the signals S and S1, S2, can result here from an unequal magnetization, from variations of the height of the teeth 5a or from a non plane-parallel installation of encoder wheel 5 in relation to the sensor electronics 6. This leads to a situation in which in an output signal S, which ultimately arises from the basic signal SG, chronologically randomly and systematically fluctuating signal interference Z(t) is superimposed on said output signal S. In other words: the basic signal is frequency-modulated or, in particular, amplitude-modulated, as is shown by the profile of the envelope curves H1, H2 in FIG. 2.

The invention is based on the fact that the fluctuating characteristics conditioned by the interference Z, such as, in particular, the amplitude of the output signal S per tooth 5a of the encoder wheel 5, are evaluated. The respective mean value of all the signal sequences which can be used for the evaluation can therefore be eliminated. This means that the signal interference Z of the output signal S can be extracted from the signal S before further signal processing by virtue of the fact that mean values are formed for the output signal S, and the mean value (this corresponds to the amplitude of SG in FIG. 2) is subtracted from the individual values of the output signal S.

In another variant, a sequence of maximums of the signal S can also be evaluated within one revolution or equivalently a sequence of minimums within one revolution can be evaluated. These variables are also representative of the interference Z which is impressed on the basic signal SG. Likewise, further signal characteristics which are easy to evaluate, such as for example the amplitudes of the intersection points of the two component signals S1, S2 which are shifted by 90° can alternatively also be used for the evaluation.

According to the invention, a current initial rotational position A which is characteristic of an instantaneous time or of an instantaneous time period of the detection of the dynamic state of the electric motor 1 is determined exclusively from the output signal S of the position encoder 7, specifically by comparing the time profile of the portion of the systematically fluctuating signal interference Z(t) of a current output signal S(t) with a time profile of the portion of the systematically fluctuating signal interference Z(t) of an output signal S(t), acquired starting from a reference initial rotational position O, of the position encoder 7.

For an encoder wheel 5 with $n_z$ teeth 5a or generally an encoder with $n_z$ poles, signal sequences which are preferably composed of a number $n_z$ of measured values can be acquired here for the signals S, S1, S2.

The measured values of the measured value sequence which is acquired for the output signal S starting from the reference initial rotational position O, and if appropriate for the signal interference Z thereof can preferably be determined in a preferred rotational position in accordance with an initial orientation of the rotor 2 defined, for example, during a final inspection after the fabrication of the electric motor 1, or by coupling to an external reference encoder, and preferably stored in a nonvolatile memory ROM, as is shown by the signal flowchart in FIG. 3. This initial measured value sequence which is recorded for the reference initial rotational position O is referred to below by y(i).

A current signal sequence of measured values is instead denoted by x(i) and can preferably be stored in a volatile memory RAM into which the measured values of the earlier measured value sequence y(i) can be transferred for signal processing.

For the further signal processing, the signal sequences $x(i)=\{x_1, x_2 \ldots x_i \ldots x_l\}$ and $y(i)=\{y_1, y_2 \ldots y_i \ldots y_k\}$ should preferably have the same length, i.e. the same number of measured values. As is shown by FIG. 3, it is therefore initially possible to check whether the number l of the measured values of the current signal sequence x(i) corresponds to the number k of the measured values of the signal sequence y(i) acquired starting from the reference initial rotational position O. If this is the case, the actual signal processing can be started.

If the number l of the measured values of the current signal sequence x(i) is larger than the number k of the measured values of the signal sequence y(i) acquired starting from the reference initial rotational position O, an adjusted signal sequence $y^*(j)=\{\{y_{1,1}, y_{2,2} \ldots y_{i,j} \ldots y_{k,k}\}, \{y_{1,k+1}, y_{2,k+2} \ldots y_{i,k+i} \ldots y_{k,k+k}\}, \{y_{1,2k+1}, y_{2,2k+2} \ldots y_{i,2k+i} \ldots y_{i,2k+k}\}, \ldots\}$ can be formed with the same number n of measured values as the number l of the measured values of the current signal sequence x(i) by simple or multiple complete and/or partial repetitive appending of the measured values y(i) of the signal sequence of the reference initial rotational position O to the original measured values thereof. This adjusted signal sequence y*(j) can then be fed in an analogous fashion to the further signal processing instead of the signal sequence y(i). Therefore, for the sake of simplicity or clarity only the signal sequence y(i) is mentioned below.

If, instead, the number l of the measured values of the current signal sequence x(i) is smaller than the number k of the measured values of the signal sequence y(i) which is acquired starting from the reference initial rotational position O, a further recording of measured values can take place.

It is therefore possible to ensure that both measured value sequences x(i) and y(i) or y*(j) are of the same length, where l is equal to k is equal to preferably $n_z$.

In order firstly to check whether the existing measured value sequences x(i), y(i) are suitable for determining the current initial rotational position A therefrom by comparing the time profile of the portion of the systematically fluctuating signal interference, and for deciding which method type is most suitable for this, evaluation characteristic variables, in particular a first evaluation characteristic variable $F_\Phi$ and a second evaluation characteristic variable $F_1$ can be formed from the signal sequences.

The first evaluation characteristic variable $F_\Phi$ provides information as to whether the necessary condition for reliable detection of the angular offset $n_{z,offs}$ under all operating states is met, said condition being that a profile of the signal variable used for the evaluation which is sufficiently characteristic over one revolution is present.

The first evaluation characteristic variable $F_\Phi$ may be formed here, in particular, as a quotient of the global maximum value of an auto-correlation function acquired from the signal sequence y(i) of the time profile of the output signal of the position encoder starting from the reference initial rotational position O, and of the maximum value of an auto-correlation function acquired from the signal sequence of the time profile of the output signal, as is expressed by the following equation (2):

$$F_\Phi = \frac{\phi_{y,y}(0)}{\max_{\tau \neq 0}(\phi_{y,y}(\tau))} \quad (2)$$

where the following applies to the asymmetrically defined auto-correlation function:

$$\phi_{y,y}(\tau) = \sum_{i=1}^{n_z} y(i) \cdot y(i+\tau) \quad (3)$$

$F\Phi$ is therein the ratio of the global maximum $M_0 = \Phi_{y,y}(0)$ of an auto-correlation, calculated according to equation (2), of the reference sequence y(i) with the next largest local maximum $M_1 = \Phi_{y,y}(T)$.

A maximum distance between the maximums $M_1$, $M_2$ is then present, for example, if a signal characteristic which is supplied by the incremental encoder 7 and which can be achieved, for example, by the configuration of the teeth 5a of the encoder wheel 5, is one such as is illustrated in FIG. 4 or FIG. 5.

FIG. 4 shows as a block diagram a first possible characteristic profile of an encoder characteristic by means of which it is possible to determine the current angular offset $n_{z,offs}$, reliably with respect to the zero position O independently of an additional interference profile which is superimposed on the ultimately measured value sequence y(i) measured and which can be caused by fluctuations during the fabrication of the encoder wheel 5. In this context, standardization or encoding which is provided by way of example in a structural fashion for the encoder 7 consists in the fact that in binary terms there are only two tooth heights: "large teeth" 5a and "small teeth" 5a. Over the circumference of the encoder wheel 5, the "large teeth" 5a and the "small teeth" 5a alternate according to a predefined pattern of tooth segments ZS1, ZS2, ZS3, ZS4, ZS5 which can be clearly detected again during the acquisition of signals. The first segment ZS1 is composed here of six large teeth 5a; the second segment ZS2 is composed of six small teeth 5a; the third segment ZS3 is composed of three large teeth 5a; the fourth segment ZS1 is composed of three small teeth 5a; and the fifth segment is composed of 18 alternately large and small teeth 5a.

FIG. 5 shows a further possible standardized profile of an encoder characteristic by means of which it is also possible to determine the angular offset $n_{z,offs}$ reliably independently of the additionally occurring profile of the signal interference Z(t) which fluctuates as a result of fabrication. In the case of the "measured values y(i)" illustrated here as a bar an additional signal portion calculated from a pseudo-random sequence is superimposed here on a uniform (constant) base signal. What is referred to as, "white noise" can advantageously be superimposed, formulated in terms of signaling equipment, on the mean value SG of the sequence y(i). These "measured values y(i)", which are in inverted commas because the method according to the invention is concerned with measured value target variables, are impressed onto the heights of the teeth 5a during the manufacture of the encoder wheel 5, wherein an average tooth height corresponds to the mean value SG of the sequence y(i).

If the time profile of the signal interference Z(t) of the current output signal S(t) differs significantly from a basic signal SG with superimposed signal interference Z which fluctuates chronologically in an exclusively random way, in particular if the first evaluation characteristic variable $F_\Phi$ assumes a value of $\geq 1.1$, a first method type can be selected according to which in each case the time profile of the portion of the systematically fluctuating signal interference Z(t) of the current output signal—represented by the signal sequence x(i)—is compared with the time profile of the portion of the systematically fluctuating signal interference of the output signal of the position encoder 7 in the reference initial rotational position O, represented by the signal sequence y(i). According to the first method type, the values of the characteristic signals which fluctuate randomly per tooth 5a are evaluated, as is also described below in detail.

If the first method type cannot be applied it is necessary to check whether the second method type can be applied. This requires a basic oscillation portion, which is characteristic of the time profile of the systematically fluctuating signal interference Z(t), to be determined from the signal sequence x(t) of the time profile of the signal interference of the output signal of the position encoder in the current rotational position and from the signal sequence y(t) of the time profile of the signal interference Z(t) of the output signal S(t) of the position encoder 7 starting from the reference initial rotational position O. In particular Fourier transformations of the signal sequences x(i), y(i) can be performed for this in the form:

$$X(i) = \text{FFT}(x(i)) \text{ and } Y(i) = \text{FFT}(y(i)) \quad (4).$$

The operand FFT describes here the performance of a fast Fourier transformation which is an algorithm for efficiently calculating the values of a discrete Fourier transformation (DFT). In such algorithms, which are known per se, in contrast to direct calculation previously calculated intermediate results are used, as a result of which there can be a saving in terms of arithmetic calculation operations.

A condition for reliable detection of the angular offset $n_{z,offs}$ according to the second method type is a sufficiently large portion $X(1)$ of the basic oscillation with respect to the quadratic sum of the entire Oscillation portions $X(i)$. As a criterion for this it is therefore possible to use the second evaluation characteristic variable $F_1$, wherein for the calculation thereof the time profile of the signal interference Z(t) of the output signal S of the position encoder 7 in the current rotational position is used, and in accordance with the following equation (5) the basic oscillation portion $X(1)$ which is characteristic of the systematically fluctuating signal interference is compared with the variable of all the oscillation portions $X(i)$.

$$F_1 = \frac{1}{z_N^2} \frac{X(1)}{\sqrt{\sum_{i=2}^{z_N} X^2(i)}} \quad (5)$$

The root value of the sum of the squares of the Fourier-transformed measured values of the signal sequence X(i) of the output signal S of the position encoder 7 in the current rotational position is used as a representative of the variable of all the oscillation portions in the equation (5).

If the time profile of the signal interference Z(t) of the current output signal S(t) of the position encoder 7 has a basic oscillation portion X(1) for the systematically fluctuating signal interference which differs significantly from all the other oscillation portions of the signal interference, in particular if the second evaluation characteristic variable $F_1$ assumes a value of ≥0.5, the second method type can be selected for the comparison which is to be carried out according to the invention.

If the time profile of the signal interference Z(t) of the current output signal S(t) of the position encoder 7 does not differ significantly from the basic signal SG having signal interference which fluctuates chronologically in an exclusively random way ($F_\Phi \approx 1$), and does not have a basic oscillation portion X(1) of the systematically fluctuating signal interference which differs significantly from all the other oscillation portions X(i) of the signal interference Z(t) ($F_1 \ll 0.5$), the conditions of use of the incremental position encoder 7 can be changed, or it must be replaced with another position encoder 7 if, for example, this is detected by recording and storage of the reference sequence y(i), taking place within the scope of the final acceptance of the motor 1. Purely oblique positioning of the encoder wheel 5 relative to the sensor electronics 6 would merely shift the amplitudes of the two component signals S1, S2 with respect to one another. In such an encoder 7, in which interference is selectively introduced into the signal profile by variation, for example of the tooth heights, but the resulting signals S(t) are only allowed to fluctuate to such an extent that complete compensation remains possible for the subsequent angular calculation and the resolution is not adversely affected.

According to the first method type for comparing the time profile of the portion of the systematically fluctuating signal interference Z(t) of the measured values of the current signal sequence x(i) with the time profile of the portion of the systematically fluctuating signal interference Z(t) composed of the measured values of the signal sequence y(i) acquired starting from the reference initial rotational position O, a cross-correlation function $\Phi_{x,y}$ is formed from the measured values of the signal sequences x(i), y(i) according to equation (6):

$$\phi_{x,y}(\tau) = \sum_{i=1}^{n_z} x(i) \cdot y(i + \tau) \tag{6}$$

The abscissa values of the cross-correlation function $\Phi_{x,y}(T)$ of the signal sequences x(i), y(i) are formed here by multiplying the value of a time increment with a number of increments, which number is assigned to the respective measured value in a signal sequence. The current initial rotational position A in terms of its relationship with the reference initial rotational position O, which can, in particular, be set initially to zero, can be determined from the cross-correlation function $\Phi_{x,y}(T)$ as an offset $n_{z,offs}$, which is obtained from the abscissa value T of the maximum of the cross-correlation function $\Phi_{x,y}(T)$.

The angular offset in degrees between the current initial rotational position A and the reference initial rotational position O of the rotor 2 can be determined here as a product of the angular speed ω of the rotor 2 and the abscissa value T of the maximum of the cross-correlation function $\Phi_{x,y}(T)$. For this purpose, it is possible to calculate with the predefined rotational speed set at a controller ("n-type controller" in FIG. 6), or else a current angular speed ω of the rotor 2, determined exclusively from the time profile of the signal sequence x(i) of the current output signal S(t) of the position encoder 7 in a known fashion can be used.

According to the second method type for comparing the time profile of the portion of the systematically fluctuating signal interference Z(t) of the measured values of the current signal sequence x(i) with the time profile of the portion of the systematically fluctuating signal interference Z(t) composed of the measured values of the signal sequence y(t) acquired starting from the reference initial rotational position O, the current initial rotational position A is determined in terms of its relationship with the reference initial rotational position O from the measured values of the signal sequences x(t), y(t), in particular according to a Fourier transformation of the measured values, as an angular offset $n_{z,off}$ which is obtained from a difference between the phase positions of the basic oscillation portions of the signal sequences x(i), y(i). The angular offset $n_{z,off}$ can be calculated here according to equation (7):

$$n_{z,offs} = \text{int}\left(\frac{\arg(Y(1)) - \arg(X(1))}{2\pi} n_z\right) \tag{7}$$

A comparison of the two method type, applied to characteristic signal sequences x(i), y(i) with different noise and sine portions shows that in the case of a high basic oscillation portion the significance of the results rises in accordance with the value of the evaluation characteristic variable F1, but the significance of the results decreases in accordance with the value of the evaluation characteristic variable $F_\Phi$, and vice versa. It is therefore particularly advantageous to combine both method types with one another, as described above with reference to FIG. 3.

FIG. 6 shows an arrangement according to the invention which is formed from a motor actuation means 100 for a small motor 1 and from a signal processing unit 200 which serves to evaluate a position. A (reference symbol "$\text{Pos}_{act}$") which is unambiguous within one revolution of the motor 1, exclusively from the two signals S1(t) and S2(t) of an incremental encoder 7. The actuation means 100 contains here an actuation circuit, wherein a three-phase bridge output stage with "gate driver" for electronic commutation is illustrated symbolically in the drawing. In the figurative illustration, the reference symbol $i_{act}$ denotes an actual current for which a current measurement is performed for the sake of overload protection (reference symbol: "$i^2t$ current limitation"). The circuit also contains an evaluation unit, which determines the current speed or rotational speed $n_{act}$ and the current position $\phi_{total}(i)$ for the signal S(t) and/or the component signals S1(t), S2(t), which come from the incremental encoder 7 which is attached to the motor 1 and which is symbolized by the "calculation of the position and rotational speed" box, as well as a rotational speed controller ("n-type controller") and position controller ("pos. controller") which is superimposed thereon.

The processing unit 200, which serves as an evaluation unit for determining the zero position O, contains a unit for determining a signal sequence x(i), y(i) which is characteristic of the signal shape of the incremental encoder 7, a memory unit ("read only memory, ROM") for at least one reference sequence x(i), a unit for determining both evaluation characteristic variables $F_\Phi$ and $F_1$ for the characteristic signal sequences x(i), y(i) and in each case one unit for determining the reference position from the comparison of the characteristic currently determined signal sequence x(i) with at least one reference sequence y(i) stored in the read only memory, according to the first or second of the two method types described above. The selection of the method which is to be used to determine the reference position is made on the basis of the significance criteria $F_\Phi$ and $F_1$.

The characteristic of signal sequences x(i), y(i) with different noise and sine portions is illustrated here by FIGS. 7 to 15.

FIGS. 7, 9, 11 and 13 relate here to a first exemplary time profile for measured values in a signal sequence x(i)—and also y(i)—of an output signal S(t) of an incremental position encoder 7 which is used in the method according to the invention. This measured value profile, to which in particular the first method type can be applied, indicates a high noise portion in the signal S(t). It clarifies the characteristic signal sequence of a position encoder 7 with a dominant portion of the non-correlated changes in the signal amplitudes which are random but are reproducible in a fashion characteristic of the selected encoder system 7, and are caused, for example by fluctuations in brightness of a reflex disk or by random fluctuations in the magnetic field of a magnetic encoder system 7. The first evaluation characteristic variable $F_\Phi$ assumes a value of 1.7 therein.

FIGS. 8, 10, 12, 14 and 15 relate to a second exemplary measured value profile in the signal sequences x(i), y(i) which has a high sine portion in the signal S(t) and to which, in particular, the second method type can therefore be applied, since the first evaluation characteristic variable $F_\Phi$ only assumes a value of 1.02 therein. The amplitude of this sine oscillation is approximately proportional to the distance between the encoder wheel 5 and the sensor electronics 6 which fluctuates over one revolution, as can be achieved by an obliquely installed encoder wheel 5.

The different curve profiles which are each shown in FIGS. 7 to 10 and FIGS. 13 and 14 relate here to various measured value temperatures. Depending on the temperature of the arrangement, the signal characteristic can change, for example, through sensitivity of the sensor used, which can change over the temperature. It is therefore possible to provide that during operation of the drive further reference sequences y(i) are determined as a function of the temperature of the drive by evaluating the signal characteristics used, and are stored in the nonvolatile memory ROM as additional references.

The corresponding ordinate values are plotted here in FIGS. 7 to 10 as they are also in FIGS. 4 and 5, against the serial tooth number i ($1 \leq i \leq n_z=36$) of the encoder wheel 5 and/or of the dimensionless discretized sampling size according to equation (1). In each case the measured values of the signal sequences x(i), y(i) can be obtained here as amplitude values of the signal S(t) from the ordinate values of FIGS. 7 and 8, while in FIGS. 9 and 10 the values of the auto-correlation functions $\Phi_{x,x}$, $\Phi_{y,y}$ are plotted as ordinate values, as are those of the cross-correlation function $\Phi_{x,y}$ in FIGS. 11 and 12. The tooth number $n_z$ of the encoder wheel 5 is also equivalent to a specific time t in a specific angle value or taking into account a constant rotational speed or angular speed ω of the rotor 2. As a result, the value T can also be read off on the abscissa, as is shown by FIGS. 11 and 12.

From a comparison of FIGS. 7 and 8 as well as of FIGS. 9 and 10 or else FIGS. 11 and 12 it becomes apparent that by applying the second method type for the comparison according to the invention it is possible to avoid a disadvantage which occurs with the first method type according to which during the evaluation a high degree of regularity occurs in the resulting profile of the characteristic signal sequence x(i), expressed for example by a small evaluation characteristic variable $F_\Phi$.

FIG. 11 shows the cross-correlation $\Phi_{x,y}(\tau)$ of a signal sequence x(i) according to FIG. 7 or FIG. 9 with a reference sequence y(i) which is shifted with respect thereto by $n_{z,off}=9$ poles (specifically teeth 5a). Owing to the clear significance of the global maximum, the angular offset $n_{z,off}$ can also be reliably determined here under the influence of measuring noise and, if appropriate, a temperature drift.

FIG. 12 shows the cross-correlation $\Phi_{x,y}(\tau)$ of a signal sequence x(i) according to FIG. 8 or FIG. 10 with a reference sequence y(i) which is also shifted with respect thereto by $n_{z,off}=9$ poles (specifically teeth 5a). Owing to the small significance of the, in this case, single maximum, the angular offset $n_{z,off}$ cannot be reliably determined here under the influence of measuring noise and, if appropriate, a temperature drift.

In the diagrams of the Fourier-transformed basic oscillation portions X(i) and Y(i) (illustrated in FIGS. 13 to 15) in the complex numerical level, the virtual parts Im of the oscillations which are characteristic of the fluctuation of the interference Z(t) of the measured values are plotted as ordinates in the case of various reference initial rotational positions O, in each case versus the corresponding real parts Re as abscissa values with the temperature as a parameter. In each case the values arg X(1) or arg Y(1) correspond here to the value of the virtual part Im in equation (7). From a comparison of FIGS. 13 and 14 it is clear here that in the case of the measured values x(i) which are to be processed according to the first method type for the comparison according to the invention, a higher level of temperature sensitivity is found to occur than in the case of such measured values to which preferably the second method type can be applied.

FIG. 15 shows the angular positions of the basic oscillation portions of a characteristic signal sequence of the type according to FIGS. 8, 10, 12 and 14 for all the relative positions, possible in the case of $n_z=36$, between the current characteristic sequence x(i) and the reference sequence y(i) stored in the read only memory ROM. It is also symbolically additionally indicated that according to equation (7) the offset with respect to the reference position O can be determined therefrom by comparing the arguments of the basic oscillation portion of the reference position arg(FFT(Y)(1)) and of the basic oscillation portion arg(FFT(X)(1)) of the currently determined characteristic signal sequence x(i).

FIG. 16 shows in a field illustration the two evaluation characteristic variables $F_\Phi$ and F1 for the significance of the measured value sequences x(i), y(i) of various incremental encoders 7 of the same design but with, in each case, different variables of the randomly fluctuating portions Z(t) of the measured value sequences, as are illustrated in an extremal fashion in FIG. 7 and/or with in each case different variables of the harmonic oscillation portions Z(t) of the sequences, as are illustrated in an extremal fashion in FIG. 8.

In the region characterized by the reference symbol B1 there are encoders 7 whose characteristics are similar to the sequence from FIG. 7 with significantly randomly fluctuating signal portions, wherein they do not have an appreciable significant basic oscillation portion. The angular offset $n_{z,offs}$ between the characteristic sequence x(i) and the reference sequence y(i) can be reliably determined here by means of the cross-correlation function $\Phi_{x,y}$ corresponding to equation (6) in conjunction with FIG. 11.

In the region denoted by B2 there are encoders which supply measured value sequences x(i), y(i) which also have a virtually negligible basic oscillation portion but at the same time also, with respect to the region B1, a significantly smaller randomly fluctuating portion of the signal interference Z(t). As long as the ratio $F_\Phi$ of the maximum—expressed as a ratio between the value of the auto-correlation function $\Phi_{y,y}$ where $\tau=0$ referring to the next largest value of the auto-correlation function $\Phi_{y,y}$—here where $F_\Phi>1.1$ but is still significantly above the influence of the measuring inaccuracy for the elements of the measured value sequence x(i), y(i), unambiguous determination of the angular offset $n_{z,offs}$ is also reliably possible in this region by means of the cross-correlation function $\Phi_{x,y}$ between the characteristic sequence x(i) and the reference sequence y(i).

The region B3 characterizes signal sequences x(i), y(i) with a comparatively large basic oscillation portion (>50%), which is expressed in a corresponding value of the second evaluation characteristic variable $F_1$. However, the value of the first evaluation characteristic variable $F_\Phi$ indicates that the signal sequences x(i), y(i) do not have a sufficient significance here any longer in the sense of the signal profile illustrated in FIG. 7. Therefore, depending on possible measuring noise of the arrangement and a possible temperature drift, it is therefore no longer possible here to determine the angular offset $n_{z,offs}$ unambiguously by means of the cross-correlation function $\Phi_{x,y}$. Instead, the angular offset $n_{z,offs}$ can, however, be determined here by comparing the angular positions of the basic oscillation portions of the characteristic sequence X and of the reference sequence Y according to equation (7).

Until now, the invention has not yet been restricted to the feature combinations defined in the independent claims but instead can also be defined by any other desired combination of specific features of the total individual features disclosed. This means that basically any individual feature of the independent claims can be omitted and/or replaced by at least one individual feature disclosed elsewhere in the application. To this extent, the claims are merely to be understood as being a first attempt at formulation of an invention.

As is already apparent from the statements above, the invention is not restricted to the illustrated exemplary embodiments either but instead a person skilled in the art can supplement or modify said invention as required by means of further expedient technical measures without departing from the scope of the invention. It is therefore possible, as already indicated, to use, for example, inductive, magneto-resistive, optical or Hall sensors as the incremental position encoders 7. In this case, the place of the tooth number $n_z$ is taken by the number of the poles of a device corresponding to the encoder wheel 5.

The invention claimed is:

1. Method for detecting the dynamic state of an electric motor (1) which has a stator and a rotor (2), in particular of a brushless, electronically commutated direct current small servomotor, comprising unambiguous determinations of rotational positions of the rotor (2) within one revolution of the rotor (2), specifically of a current rotational position ($\phi_{total}$) relative to a current initial rotational position (A) as well as of this current initial rotational position (A) relative to a reference initial rotational position (O), wherein an incremental position encoder (7) is used which respectively outputs an output signal (S) for a number of increments within one revolution of the rotor (2), which output signal (S) is produced by superposition of a basic signal (SG) with chronologically randomly and systematically fluctuating signal interference (Z), wherein the basic signal (SG) is composed of at least two component signals (S1, S2) which change periodically in each case in accordance with the rotational position of the rotor (2) and are in a fixed angular relationship with one another, wherein the current initial rotational position (A) is determined exclusively from the output signal (S) of the position encoder (7) and is determined by comparing the time profile of the portion of the systematically fluctuating signal interference (Z) of measured values of a current signal sequence (x(i)) with a time profile of the portion of the systematically fluctuating signal interference (Z) of measured values of a signal sequence (y(i)), acquired from the reference initial rotational position (O), of the output signal (S) of the position encoder (7).

2. Method according to claim 1, wherein the time profile of the signal interference (Z) of the output signal (S) is extracted before further signal processing by forming mean values from the measured values of the signal sequences (x(i), y(i)) of the output signal (S) and subtracting the mean value from the measured values of the signal sequences (x(i), y(i)) from the signal sequences (x(i), y(i)).

3. Method according to claim 1, wherein the measured values of the signal sequence (y(i)), acquired from the reference initial rotational position (O), and, if appropriate, of the signal interference (Z) of the output signal (S) of the position encoder (7) are determined after an initial orientation of the rotor (2), defined for example during final testing after the fabrication of the electric motor (1), in a preferred rotational position (O) or by coupling to an external reference encoder, and are stored in a nonvolatile memory (ROM).

4. Method according to claim 3, wherein the measured values of the signal sequence (y(i)), acquired from the reference initial rotational position (O) and, if appropriate, of the signal interference (Z) of the output signal (S) of the position encoder (7) are determined at a plurality of different temperatures and stored in the nonvolatile memory (ROM).

5. Method according to claim 1, wherein the component signals (S1, S2) each change in accordance with the rotational position of the rotor (2) according to a harmonic angular function.

6. Method according to claim 1, wherein in each case an evaluation characteristic variable ($F_\phi$, $F_1$) for the characteristic of the time profile of the interference (Z) is determined from the signal sequences (x(i), y(i)) of the time profile of the signal interference (Z) of the output signal (S) of the position encoder (7) starting from the reference initial rotational position (O) and/or in the current rotational position ($\phi_{total}$) of the rotor (2), wherein in accordance with a value of these evaluation characteristic variables ($F_\phi$, $F_1$) the selection is made of a first or of a second method type, according to which in each case the time profile of the portion of the systematically fluctuating signal interference (Z) of the current output signal (S) is compared with the time profile of the portion of the systematically fluctuating signal interference (Z) of the output signal (S) of the position encoder (7) in the reference initial rotational position (O), or a change takes place in the conditions of use of the incremental position encoder (7) and/or in the incremental position encoder (7) itself.

7. Method according to claim 6, wherein a first evaluation characteristic variable ($F_\phi$) which is acquired from the time profile of the signal interference (Z) of the output signal (S) of the position encoder (7) starting from the reference initial rotational position (O), is acquired by comparing the signal sequence (y(i)) of the time profile of the signal interference (Z) of the output signal (S) of the position encoder (7) starting from the reference output rotational position (O) with a time profile of the output signal (S) with exclusively randomly fluctuating signal interference (Z).

8. Method according to claim 7, wherein a position encoder (7) is used with an encoder characteristic in which a time profile of the exclusively randomly fluctuating signal interference (Z) of the output signal (S) is impressed structurally in accordance with superimposition of a pattern which is, in particular, binary and/or segmented over the poles of the encoder and/or of a pseudo noise signal, such as, in particular, white noise, on the basic signal (SG).

9. Method according to claim 7, wherein the first evaluation characteristic variable ($F_\phi$), which is acquired from the time profile of the signal interference (Z) of the output signal (S) of the position encoder (7) starting from the reference initial rotational position (O) is formed as a quotient of the global maximum value of an auto-correlation function ($\phi_{y,y}$), acquired from the signal sequence (y(i)) of the time profile of the output signal (S) of the position encoder (7) starting from the reference initial rotational position (O), and of the maximum value of an auto-correlation function ($\phi_{y,y}$) acquired from the signal sequence of the time profile of the output signal (S) with exclusively randomly fluctuating signal interference (Z).

10. Method according to claim 9, wherein if the time profile of the signal interference (Z) of the current output signal (S) of the position encoder (7) differs significantly from a basic signal with signal interference (Z) which fluctuates chronologically in an exclusively random way, in particular if the first evaluation characteristic variable ($F_\phi$) assumes a value of ≥1.1, a first method type is selected according to which in each case the time profile of the portion of the systematically fluctuating signal interference (Z) of the current output signal (S) is compared with the time profile of the portion of the systematically fluctuating signal interference (Z) of the output signal (S) of the position encoder (7) in the reference initial rotational position (O).

11. Method according to claim 6, wherein a second evaluation characteristic variable ($F_1$), which is acquired from the time profile of the signal interference (Z) of the output signal (S) of the position encoder (7) in the current rotational position, is acquired from a comparison of the basic oscillation portion, characteristic of the systematically fluctuating signal interference (Z), with the variables of all the oscillation portions of the signal interference (Z).

12. Method according to claim 11, wherein the root value of the sum of the squares of the preferably Fourier-transformed measured values (X(i)) of the signal sequence (x(i)) of the time profile of the output signal (S) or of the signal interference (Z) of the output signal (S) of the position encoder (7) in the current rotational position is used as representative of the variables of all the oscillation portions.

13. Method according to claim 12, wherein if the time profile of the signal interference (Z) of the current output signal (S) of the position encoder (7) has a basic oscillation portion for the systematically fluctuating signal interference (Z) which differs significantly from all the other oscillation portions of the signal interference (Z), in particular if the second evaluation characteristic variable ($F_1$) assumes a value of ≥0.5, a second method type is selected according to which, in each case, the time profile of the portion of the systematically fluctuating signal interference (Z) of the current output signal (S) is compared with the time profile of the portion of the systematically fluctuating signal interference (Z) of the output signal (S) of the position encoder (7) in the reference initial rotational position (O).

14. Method according to claim 1, wherein a basic oscillation portion, which is characteristic of the time profile of the systematically fluctuating signal interference (Z) is determined, in particular, in each case as a value acquired by Fourier transformation from the signal sequence (x(i)) of the time profile of the signal interference (Z) of the output signal (S) of the position encoder (7) in the current rotational position, and from the signal sequence (y(i)) of the time profile of the signal interference (Z) of the output signal (S) of the position encoder (7) starting from the reference initial rotational position (O).

15. Method according to claim 14, wherein according to a method type/the second method type for comparing the time profile of the portion of the systematically fluctuating signal interference (Z) of the measured values of the current signal sequence (x(i)) with the time profile of the portion of the systematically fluctuating signal interference (Z) composed of the measured values of the signal sequence (y(i)) acquired starting from the reference initial rotational position (O), the current initial rotational position (A) is determined in terms of its relationship with a reference initial rotational position from the measured values of the signal sequences (x(i), y(i)), in particular according to a Fourier transformation of the measured values, as an angular offset ($n_{z,offs}$) which is obtained from a difference between the phase positions of the basic oscillation portions of the signal sequences (x(i), y(i)).

16. Method according to claim 1, wherein if neither the time profile of the signal interference (Z) of the current output signal (S) of the position encoder (7) differs significantly from a basic signal having signal interference (Z) which fluctuates chronologically in an exclusively random way, in particular if the first evaluation characteristic variable ($F_\phi$) assumes a value of equal to 1, nor the time profile of the signal interference (Z) of the current output signal (S) of the position encoder (7) has a basic oscillation portion for the systematically fluctuating signal interference (Z) which differs significantly from all the other oscillation portions of the signal interference (Z), in particular if the second evaluation characteristic variable ($F_1$) assumes a value of less than 0.5, a change takes place in the conditions of use of the incremental position encoder (7) and/or in the incremental position encoder (7) itself, such as a replacement thereof.

17. Method according to one claim 1, wherein according to a method type/the first method type for comparing the time profile of the portion of the systematically fluctuating signal interference (Z) of the measured values of the current signal sequence (x(i)) with the time profile of the portion of the systematically fluctuating signal interference (Z) composed of the measured values of the signal sequence (y(i)) acquired starting from the reference initial rotational position (O), a cross-correlation function is formed from the measured values of the signal sequences (x(i), y(i)).

18. Method according to claim 17, wherein the current initial rotational position (A) is determined in its relationship with a reference initial rotational position (O) as an angular offset ($n_{z,offs}$) which is obtained from the abscissa value of the maximum of the cross-correlation function.

19. Method according to claim 18, wherein the abscissa values of the cross-correlation function of the signal sequences (x(i), y(i)) are formed by multiplying the value of a time increment with a number of increments, which number is assigned to the respective measured value in a signal sequence (x(i), y(i)).

20. Method according to claim 18, wherein the angular offset ($n_{z,offs}$) between the current initial rotational position (A) and the reference initial rotational position (O) of the rotor is determined as a product of the angular speed of the rotor and the abscissa value of the maximum of the cross-correlation function.

21. Method according to claim 1, wherein a current angular speed of the rotor is determined exclusively from the time profile of the signal sequence (x(i)) of the current output signal (S) of the position encoder (7).

22. Method according to claim 1, wherein before any signal processing the number of measured values of the current signal sequence (x(i)) of the output signal (S) of the position encoder (7) is compared with the number of measured values of the signal sequence (y(i)), acquired starting from the reference initial rotational position (O), of the output signal (S) of the position encoder (7), and wherein if the number of measured values of the current signal sequence (x(i)) is higher than the number of measured values of the signal sequence (y(i)) acquired starting from the reference initial rotational position (O), an adjusted signal sequence (y*(j)) with the same number of measured values as the number of measured values of the current signal sequence (x(i)) is formed by simple or multiple complete and/or partial repetitive appending of the measured values to the signal sequence (y(i)) from the signal sequence (y(i)) acquired starting from the reference initial rotational position (O).

23. Method according to claim 1, wherein the number of increments is in the range from 3000 to 100,000 with respect to one complete revolution of the rotor (2).

24. Method according to claim 1, wherein an inductive, magneto-resistive, optical or Hall sensor is used as the incremental position encoder (7).

25. Arrangement for detecting the dynamic state of an electric motor (1), in particular of a brushless, electronically commutated direct current small servomotor (1), in particular for carrying out a method according to claim 1, comprising a motor actuation means (100) for the electric motor (1), an incremental position encoder (7) and a signal processing unit (200), wherein the processing unit (200) which is used for unambiguously determining rotational positions of the rotor (2) within one revolution of the rotor (2) of the electric motor (1), specifically a current rotational position ($\phi_{total}$) relative to a current initial rotational position (A) and this current initial rotational position (A) relative to a reference initial rotational position (O), comprises a unit for determining a signal sequence (x(i), y(i)) which is characteristic of a signal (S) of the position encoder (7), a nonvolatile memory (ROM) for at least one reference sequence x(i) of the signal (S), and two units for determining, in each case, a first evaluation characteristic variable ($F_\phi$) or a second evaluation characteristic variable ($F_1$) for the signal sequences (x(i), y(i)) as well as in each case one unit, which is assigned to each unit for determining the evaluation characteristic variables ($F_\phi$, $F_1$) and has the purpose of determining an angular offset ($n_{z,offs}$) of the current initial rotational position (A) relative to the reference initial rotational position (O) from the comparison of a current signal sequence x(i) with at least one reference sequence y(i) which is stored in read only memory (ROM), wherein the units for determining the angular offset ($n_{z,offs}$) are configured in such a way that the angular offset ($n_{z,offs}$) is determined according to, in each case, different method types for signal processing of the current signal sequence x(i).

26. Arrangement according to claim 25, further comprising components for implementing the method features of claim 1.

* * * * *